March 18, 1969 A. ELBINDARI 3,433,892

COMPOSITE ELECTRICAL CONDUCTOR

Original Filed July 17, 1964

AHMED EL BINDARI
*INVENTOR.*

BY Charles M. Hogan
Melvin E. Frederick
ATTORNEYS

United States Patent Office 3,433,892

Patented Mar. 18, 1969

3,433,892

COMPOSITE ELECTRICAL CONDUCTOR

Ahmed El Bindari, Cambridge, Mass., assignor to Avco Corporation, Cincinnati, Ohio, a corporation of Delaware Original application July 17, 1964, Ser. No. 383,392, now Patent No. 3,372,470, dated Mar. 12, 1968. Divided and this application Aug. 30, 1967, Ser. No. 664,537

U.S. Cl. 174—126 3 Claims

Int. Cl. H01b *5/02*

ABSTRACT OF THE DISCLOSURE

A composite superconductor wherein a superconductive material coated with a normal metal is embedded in and interdiffused with an outer coating of normal metal.

This is a division of application Ser. No. 383,392 filed July 17, 1964, now U.S. Patent No. 3,372,470 issued Mar. 12, 1968.

This invention relates to making composite conductors and more particularly to making low resistance electrical connections between an electrically conducting metal and a material different from this metal.

In the semiconductor art, as well as the superconductive art, it is desirable to provide electrical connections having as low a resistance as possible. For example, in the superconductive art, it is often necessary in a superconducting coil, for example, to provide an electrical connection between a normal material and a superconducting material. Superconducting coils are generally suspended in a low temperature environment, such as, for example, a liquid helium bath which reduces the temperature of the coil to lower than the critical temperature of the superconducting material utilized. Since heat is generated within a normal material when current is flowing through it, it is desirable that the resistance of any such normal material, including any contact resistance between the normal material and the superconducting material, be as low as possible to keep the amount of heat generated in the low temperature environment as small as possible.

Electrical connections resulting from soldering (i.e., using In or Sn base solders) are generally not satisfactory for superconducting applications because an intermetallic compound is formed which has an undesirably high resistance, i.e., a resistance higher than the bulk metal comprising the normal material. Further, the temperatures required for brazing and welding and the like generally destroy or at least adversely affect the superconducting characteristics of superconducting material. The principal object of the present invention is to provide a method of making low resistance electrical connections.

Another object of the present invention is to provide a method of making an electrical connection between normal material and a superconducting material.

A further object of the present invention is to provide a method of making a conductor comprising a normal material and a superconducting material.

A still further object of the present invention is to provide a method of making a conductor comprising a normal material and a superconducting material wherein the contact resistance between the superconducting material and the normal material is not substantially measurably greater than the resistance of the normal material.

The novel features that are considered characteristic of the invention are set forth in the appended claims; the invention itself, however, both as to its organization and method of operation, together with additional objects and advantages thereof, will best be understood from the following description of a specific embodiment, when read in conjunction with the accompanying drawings, in which:

Figure 1:
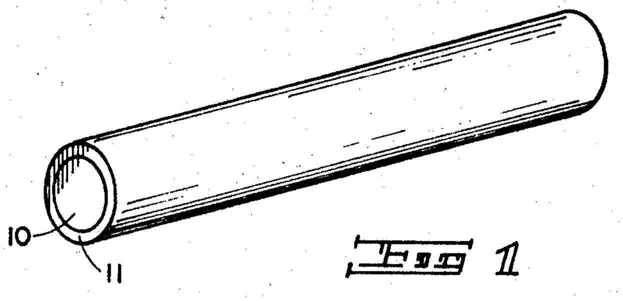
FIGURE 1 is a perspective view of a superconducting wire surrounded by a sheath of electrically-conductive normal metal that has been deposited on the superconducting material.

Referring now to FIGURE 1, there is shown a superconducting material 10 coated with a sheath of normal material 11. Any superconducting material, such as molybdenum-rhenium, bismuth-lead, the compounds $Nb_3Sn$ and $V_3Ga$, alloys of niobium with zirconium, and alloys of niobium and titanium may be coated with a normal material, such as aluminum, cadium, copper, gold, silver, platinum, and rhodium. It is important, however, that the normal material be deposited on the superconducting material as by electroplating or vapor deposition which provides a uniform deposition that adheres to and that is in continuous intimate contact with the superconducting material. Furthermore, the coating on the superconductor keeps the superconductor clean and prevents any atmospheric deterioration. The adherence of the plated coating is a measure of the cleanliness of the superconductor. The superconducting material which presently is most conveniently available as a wire, can be most expeditiously coated with the normal metal by conventional electroplating techniques. In accordance with these techniques, the wire is made cathodic in a plating solution containing the desired cation. Preferably, an inert anode such as platinum is utilized, although if agitation means are provided an anode formed of the desired metal can be used. The conventional cyanide electroplating baths, among others known to the art, containing the desired metal are used. The art is aware of suitable concentration and plating conditions, for example, as set forth in the yearly publication, Metal Finishing Guide Book, published by Metal and Plastics Publications, Incorporated. The art is equally aware of the conditions and procedure for vapor depositing a normal material on a superconducting material.

After superconducting material, for example, wire, as shown in FIGURE 1, has been provided with a sheath of normal material, one or more of such coated wires may be deposited in grooves 13 in one surface 12 of electrically-conductive bulk metal 14. The contacting portions of the coated wires and the bulk material should of course be clean when the coated wires are deposited in the grooves or embedded in the bulk material. Although special steps for removing oxidation may be taken if desired, for satisfactory results the cleaning operation need only comprise degreasing the coated wires and bulk material. While the bulk metal 14 is preferably the same as that used to coat the superconducting wire, it need not necessarily be the same so long as the metal 11 deposited on the superconducting material 10 and the bulk metal 14 do not form intermetallic compounds when subjected to a heat treatment which substantially adversely affects surface resistivity and/or current-carrying capacity of the superconducting material. Broadly speaking, because of economic considerations, aluminum and copper are the most attractive normal metals for fabricating conductors and it is obviously simpler and cheaper to use the same metal for the deposited metal and the bulk metal. The selection of the particular normal metal or metals is not critical so long as the deposited metal does not react chemically with the superconducting material and is substantially incapable of forming with the bulk metal at temperatures less than about the annealing temperatures of these metals a metallic compound having a high resistivity.

While the temperature and time for heat treating currently available superconducting materials to increase their current-carrying capacity is well known in the art, the optimum temperature and time for heat treating a particular superconducting material to increase its current-carrying capacity may be easily and quickly empirically determined. For example, if niobium 25% zirconium wires are heat treated to a temperature of about 600° centigrade for approximately one-half hour, it has been found that the current-carrying capacity of these wires is increased from about 50 amperes to about 105 amperes in a magnetic field of about 50 kilogauss. On the other hand, it is possible to reduce the heat treating temperature to, for example, about 400° C. if the time of heat treatment is extended to, for example, about one hour.

Figure 2:
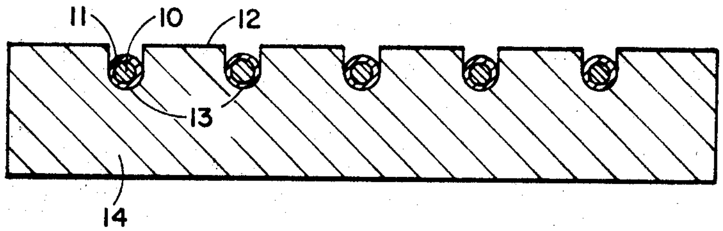
FIGURE 2 is a cross-sectional view of a wire of FIGURE 1 resting in grooves in an electrically-conductive normal metal.
Figure 3:
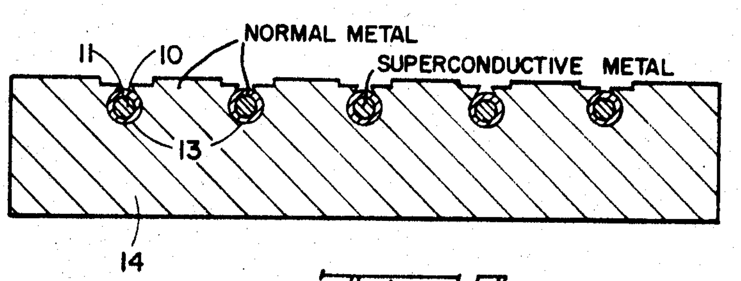
FIGURE 3 is a cross-sectional view of a conductor formed in accordance with the present invention wherein the bulk metal of FIGURE 2 has been deformed to apply pressure between it and the coated superconducting wire.

FIGURE 3 shows the wires of FIGURE 2 securely embedded in the bulk material. This may be most conveniently achieved by cold working as by pressing or rolling the bulk metal to deform it sufficiently to continuously apply pressure to the superconducting wire and thereby provide a uniform and continuous intimate contact between the bulk metal and the metallic coating on the superconducting wires. After the abutting surfaces of the bulk metal and the metal deposited on the superconducting wire have been brought into intimate contact under pressure, they are subjected to a heat-treating step carried out in vacuo or an inert atmosphere. Heat treatment or annealing at excessive temperatures for excessive lengths of time must be avoided on penalty of destroying the superconducting characteristics of the wire. The heat-treating step is most advantageously carried out in vacuo or an inert atmosphere at a temperature and for a period of time sufficient to allow interdiffusion of the metal deposited on the superconducting material with the bulk metal but insufficient to cause diffusion of the deposited material into the superconducting material. Within the above limits, the temperature and time of heat treatment is selected to produce the greatest possible current-carrying capacity in the superconducting wire.

Thus, niobium 25% zirconium, a superconductor which is commonly used today in the manufacture of superconducting coils, can be commercially obtained as a wire with a copper plating about one mil thick, the wire diameter being about ten mils. This type of superconductor is heat treatable and the maximum current-carrying properties are achieved when the superconductor is heat treated at about 560° C. for about 45 minutes. At about 560° C. copper interdiffuses quite readily.

In one instance, in accordance with the present invention, such a conventional copper plated Nb–25% Zr wire together with conventional copper wires were inserted in a copper tube having a one-eighth inch internal diameter and the whole assembly pressed in a die. Thereafter, this composite conductor was placed in a vacuum furnace and heated to 560° C. for about one hour. Before annealing the surface resistivity $\rho_s$ of the composite conductor was $6.5\times10^{-6}$ ohms per square centimeter. After annealing the surface resistivity $\rho_s$ was reduced to $$0.010\times10^{-6}$$

ohms per square centimeter and the current-carrying capacity of the superconductor approximately doubled at about 48 kilogauss.

In another instance, conventional copper plated Nb–25% Zr wires were embedded in grooves in a flat copper strip. The flat copper strip was .50" x .040" and provided with grooves .015" x .020". The superconductor wires were embedded in the grooves by pressing the composite conductor in a press. Before annealing at about 560° C. for about one hour $\rho_s$ was $1.95\times10^{-6}$ ohms per square centimeter. After annealing $\rho_s$ was reduced to $$.012\times10^{-6}$$

ohms per square centimeter and the current-carrying capacity of the superconductor again approximately doubled.

In a still further instance, which is particularly suited for use with long lengths of superconductor, copper plated Nb–25% Zr wires were embedded in a grooved, flat strip of copper substantially the same as that described immediately hereinabove. In this case, however, rollers were used to embed the wires in the grooves in the copper strip. Again the composite conductor was annealed at about 560° C. for about one hour. Before annealing $\rho_s$ was $12.4\times10^{-6}$ ohms per square centimeter. After annealing $\rho_s$ was reduced to $.007\times10^{-6}$ ohms per square centimeter.

In a still further instance, using the same annealing technique, aluminum as the bulk conductor, and a copper plated Nb–25% Zr write produced results which, while not quite as good as those noted above, were satisfactory. This is believed to be due to the fact that there was partial melting of the copper-aluminum interface due to the formation of a eutectic at about 540° C. Before annealing $\rho_s$ was $16.9\times10^{-6}$ ohms per square centimeter and after annealing $\rho_s$ was reduced to $.051\times10^{-6}$ ohms per square centimeter.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

I claim:

1. A composite electrical conductor comprising:
(a) an elongated superconductive conductor;
(b) a thin layer of normal metal in adhering and continuous intimate contact with and covering substantially the outer surface of said superconductive conductor, said layer having a cross section that is small compared to the cross section of said superconductive conductor; and
(c) an elongated normal metal conductor having a cross section at least equal to the cross section of said superconductive conductor, said coated superconductive conductor being at least substantially embedded in said normal conductor and said thin layer of normal metal being interdiffused with said normal conductor, said coating and said normal metal conductor having a low temperature electrical conductivity of the order of copper at the temperature at which said superconductive conductor is superconductive.

2. A composite electrical conductor comprising:
(a) an elongated superconductive conductor;
(b) a thin layer of normal metal in adhering and continuous intimate contact with and covering substantially the outer surface of said superconductive conductor, said layer having a cross section that is small compared to the cross section of said superconductive conductor; and
(c) an elongated normal metal conductor having a cross section at least equal to the cross section of said superconductive conductor, said coated superconductive conductor being at least substantially embedded in said normal conductor and said thin layer of normal metal being interdiffused with said normal conductor but not substantially interdiffused with said superconductive conductor.

3. A composite electrical conductor comprising:
(a) at least one elongated superconductive conductor;
(b) a thin layer of normal metal in adhering and continuous intimate contact with and covering substantially the outer surface of said superconductive conductor, said layer having a cross section that is small compared to the cross section of said superconductive conductor; and (c) an elongated normal metal conductor having a cross section at least equal to the cross section of said superconductive conductor, said coated superconductive conductor being at least substantially embedded in said normal conductor and said thin layer of normal metal being interdiffused with said normal conductor but not substantially interdiffused with said superconductive conductor, said layer of normal metal and said normal metal conductor being substantially incapable of forming with each other a metallic compound having an electrical resistivity substantially greater than that of said normal conductor at the temperature at which said superconductive conductor becomes superconductive.

References Cited

UNITED STATES PATENTS

| | | |
|---|---|---|
| 3,200,368 | 8/1965 | Stekly. |
| 3,247,473 | 4/1966 | Allen. |
| 3,366,728 | 1/1968 | Garwin. |

LEWIS H. MYERS, *Primary Examiner.*

E. GOLDBERG, *Assistant Examiner.*

U.S. Cl. X.R.

29—197; 174—94; 335—216; 339—278

UNITED STATES PATENT OFFICE
CERTIFICATE OF CORRECTION

Patent No. 3,433,892 March 18, 1969

Ahmed El Bindari

It is certified that error appears in the above identified patent and that said Letters Patent are hereby corrected as shown below:

Column 4, line 17, "write" should read -- wire --; line 48, "coating" should read -- thin layer of normal metal --.

Signed and sealed this 14th day of April 1970.

(SEAL)
Attest:

Edward M. Fletcher, Jr.
Attesting Officer

WILLIAM E. SCHUYLER, JR.
Commissioner of Patents